(12) United States Patent
Park et al.

(10) Patent No.: US 6,265,294 B1
(45) Date of Patent: Jul. 24, 2001

(54) INTEGRATED CIRCUIT HAVING DOUBLE BOTTOM ANTI-REFLECTIVE COATING LAYER

(75) Inventors: Stephen Keetai Park, Cupertino; Guarionex Morales, Sunnyvale; Bharath Rangarajan, Santa Clara; Jeff Shields, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/373,084

(22) Filed: Aug. 12, 1999

(51) Int. Cl.[7] .................... H01L 21/425; H01L 21/76; H01L 21/4763; H01L 21/461; H01L 21/31
(52) U.S. Cl. .................... 438/533; 438/453; 438/637; 438/691; 438/769
(58) Field of Search .................... 438/533, 253, 438/254, 399, 453, 766, 769, 697, 691, 692, 637

(56) References Cited

U.S. PATENT DOCUMENTS

| | | | |
|---|---|---|---|
| 5,518,948 | * 5/1996 | Walker | 438/396 |
| 5,936,272 | * 8/1999 | Lee | 257/306 |
| 6,004,850 | * 12/1999 | Lucas | 438/301 |
| 6,004,857 | * 12/1999 | Hsiao et al. | 438/396 |
| 6,013,582 | * 1/2000 | Ionov et al. | 438/718 |
| 6,113,140 | * 10/2000 | Yu et al. | 438/624 |

\* cited by examiner

*Primary Examiner*—Charles Bowers
*Assistant Examiner*—Brook Kebede
(74) *Attorney, Agent, or Firm*—Foley & Lardner

(57) ABSTRACT

A fabrication method reduces the amount of discoloration on interlevel dielectric layers due to anti-reflective coatings (ARC). The invention utilizes a barrier layer, such as, silicon nitride (SiN) that prevents the anti-reflective coating from contacting the interlevel dielectric layer (ILD0). The anti-reflective coating can be silicon oxynitride (SiON) deposited by LPCVD or PECVD.

20 Claims, 2 Drawing Sheets

INTEGRATED CIRCUIT HAVING DOUBLE BOTTOM ANTI-REFLECTIVE COATING LAYER

FIELD OF THE INVENTION

The present invention relates to integrated circuits (ICs) and a method of fabricating integrated circuits. More particularly, the present invention relates to an anti-reflective coating (ARC) layer and a contact fabrication process.

BACKGROUND OF THE INVENTION

Integrated circuit (IC) fabrication generally requires that precisely controlled quantities of impurities be introduced into selected regions of a semiconductor substrate and that conductive, semiconductive, and insulative structures be built by selectively depositing and removing layers of material. These regions and structures are subsequently interconnected to create components and ultra-large scale integrated (ULSI) circuits. The patterns that define such regions and structures are typically created by photolithographic processes, wherein layers of photoresist material are deposited on either the substrate alone or on layers which have been grown or deposited above the substrate.

The photoresist material is selectively exposed to electromagnetic energy, such as, ultra-violet (UV) light, electrons, or x-rays, to define a pattern of photoresist material. The electromagnetic energy is transmitted through a cell or overlay material to define the pattern. The photoresist material can be negative or positive photoresist material.

An IC structure, such as, a contact, is often formed in a photolithographic process. A contact can be utilized to connect a conductive or metal layer to a gate conductor, a source, or a drain associated with a transistor formed on a substrate. Alternatively, the contact can connect two or more conductive layers, can connect to capacitive structures, or can connect to various semiconductive regions.

The formation of a contact is exemplarily described as follows. A contact can be formed after a gate structure or stack has been provided on a semiconductor substrate. The gate stack is located between a source and a drain region of a transistor. The transistor can be a flash memory transistor, a metal oxide semiconductor field effect transistor (MOSFET), or other device.

The gate stack is covered by an interlevel dielectric layer (ILDO) which isolates the gate stack from subsequent metal layers. The interlevel dielectric layer can be silicon dioxide, boron phosphosilicate glass (BPSG), or other insulative material. The interlevel dielectric layer is often planarized in a chemical mechanical polish (CMP) process and then selectively covered by photoresist material. The interlevel dielectric layer is etched in accordance with the photoresist material to form apertures for contacts.

Generally, an anti-reflective coating (ARC) layer is deposited on a top of the insulative layer before etching. ARC layers are particularly important for deep UV or i-line lithography associated with scaled-down CMOS devices and flash memory devices. The ARC layer reduces line width variations due to steps on the IC structure. (The ARC layer serves to planarize the top surface of the substrate.) The ARC layer is typically a polymer film (organic, e.g., CD11), which is highly absorbing and non-bleaching at the exposure wavelengths associated with the photolithographic process. The ARC layer absorbs most of the radiation (70–85%) that penetrates the photoresist material and, thereby, substantially reduces standing wave effects and scattering from topographical features.

One exemplary type of ARC material is silicon oxide nitride (SiON). The SiON material can be utilized as a bottom ARC (BARC) layer in a deep ultra-violet (UV) contact lithographic process. Generally, the thickness is approximately 100–500 Å. After the photoresist material is selectively removed, the SiON material layer is etched in accordance with the pattern of the photoresist material to define an aperture. The interlevel dielectric layer is etched through the aperture until the top surface of the substrate is reached.

After etching the interlevel dielectric layer, a conformal layer of conductive material, such as, tungsten (W), is deposited on top of the SiON layer and within the aperture. The tungsten material is removed from the top of the SiON layer by a tungsten polishing process (a CMP process). After the tungsten is removed, the SiON layer is removed.

Heretofore, after ARC layer removal processes, material associated with the tungsten layer and the ARC layer is not completely removed from the interlevel dielectric layer. In fact, the material from the contact and the ARC layer can generate discoloration on top of the interlevel dielectric layer. The discoloration on the interlevel dielectric layer can disrupt subsequent inspection (post-W inspection), such as, inspection by equipment manufactured by KLA Tencor. Such discoloration can prevent actual defects from being detected.

Additionally, conventional CMOS devices and flash memories can be subjected to charge gain and charge loss problems. For example, hydrogen and moisture from interlevel dielectric layers above the contact can diffuse into the gate stack. The hydrogen and moisture aggravate the charge gain and loss problem.

Thus, there is a need for ensuring that anti-reflective coatings do not interfere with KLA inspection. Further, there is a need for preventing discoloration on ILD layers from ARC and metal layers. Further still, there is a need for ensuring that the entire anti-reflective coating is removed during contact formation. Even further still, there is a need to prevent charge gain and charge loss due to hydrogen and moisture from interlevel dielectric layers.

SUMMARY OF THE INVENTION

The present invention relates to a method of fabricating an integrated circuit. The method includes steps of depositing an insulative layer over a gate stack, depositing a silicon nitride layer over the insulative layer, and depositing an anti-reflective coating layer over the silicon nitride layer. The method also includes etching the insulative layer, the silicon nitride layer, and the anti-reflective coating layer for a contact and removing the anti-reflective coating layer.

The present invention also relates to a method of fabricating a contact for an integrated circuit. The integrated circuit includes a gate stack covered by an insulative layer. The method includes depositing a silicon nitride layer over the insulative layer, depositing a silicon oxynitride layer over the silicon nitride layer, etching an aperture through the insulative layer, the silicon nitride layer, and the silicon oxynitride layer, and depositing a tungsten material in the aperture to form the contact.

The present invention even further still relates to an integrated circuit. The integrated circuit is manufactured by a method that includes the steps of depositing an insulative layer over a gate stack, depositing a silicon nitride layer over the insulative layer, depositing an anti-reflective coating layer over the silicon nitride layer, and etching the insulative layer, the silicon nitride layer, and the anti-reflective coating layer to form an aperture. The method also includes depositing a conformal conductive layer over the anti-reflective coating layer and in the aperture, and removing the conformal conductive material above the anti-reflective coating layer and the anti-reflective layer by a polishing technique, thereby leaving the conductive material in the aperture to form a contact.

BRIEF DESCRIPTION OF THE DRAWINGS

The preferred exemplary embodiments will be described hereinafter, wherein like numerals denote like elements and.

DETAILED DESCRIPTION OF THE PREFERRED EMBODIMENT

Figure 1:
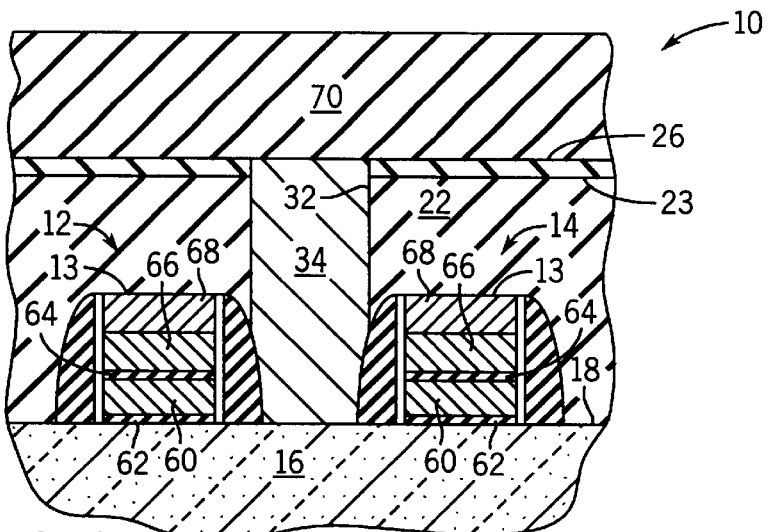
FIG. 1 is a cross sectional view of an integrated circuit including a contact manufactured in accordance with an exemplary embodiment.

With reference to FIG. 1, a portion of an integrated circuit 10 includes a transistor 12 and a transistor 14. Transistors 12 and 14 can be MOSFET transistors, floating gate transistors, or other electrical devices. Transistors 12 and 14 are preferably flash transistors including gate stacks or structures 13.

Transistors 12 and 14 are provided on a semiconductor substrate 16 which is preferably silicon. Alternatively, substrate 16 can be gallium arsenide, a silicon-on-insulator layer, an epitaxial layer, or other semiconductive base layer. Substrate 16 can be part of a single crystal silicon wafer.

Substrate 16 has a top surface 18. Transistors 12 and 14 have gate structures 13 disposed on top surface 18. Each of structures 13 includes a floating gate layer 60 (poly 1 layer), a gate oxide layer 62, a control gate dielectric layer 64 (ONO layer), and a control gate 66 (poly 2 layer). A tungsten silicide layer 68 can be provided over control gate 66.

Gate structures 13 and top surface 18 are covered by an interlevel dielectric layer 22. Interlevel dielectric layer 22 can be silicon dioxide, boron phosphosilicate glass (BPSP), or other material. Preferably, interlevel dielectric layer 22 is an interlayer dielectric zero (ILD0) layer located between top surface 18 of substrate 16 and a first conductive layer 70 (metal 1). Interlevel dielectric layer 22 is preferably 9000 Å thick and is deposited by chemical vapor deposition (CVD). Interlevel dielectric layer 22 is preferably thicker than gate structures 13 associated with transistors 12 and 14.

Gate structures 13 are between 4000–5000 Å thick control gate dielectric; layer 64 is a 200 Å thick layer of ONO. Floating gate layer 60 is a 1500 Å thick layer of polysilicon, and tungsten silicide layer 68 is a 1000–1200 Å thick layer. Control gate layer 66 is a 1200–1500 Å thick layer of polysilicon.

A layer 26 is disposed on a top surface 23 of interlevel dielectric layer 22. Layer 26 is preferably a barrier layer. Layer 26 can be deposited by plasma enhanced (PE) CVD or low pressure (LP) CVD as silicon nitride ($Si_3N_4$). Layer 26 preferably has a thickness from 100 to 1000 Å (e.g., 300–500 Å).

An aperture 32 is disposed through layer 26 and layer 22 and extends to top surface 18 of substrate 16. Aperture 32 is filled with a conductive material, such as, a tungsten (W) plug 34. Tungsten plug 34 is a contact for integrated circuit 10 and can couple substrate 16 to a subsequently deposited metal layer, such as, first conductive layer 70 (metal 1).

First conductive layer 70 is disposed over layer 26. First conductive layer 70 is preferably an Al/Cu conductive line. First conductive layer 70 can be a bit line coupled to the contact or tungsten plug 34 for transistors 12 and 14. Layer 26 can prevent diffusion of hydrogen and moisture from above first conductive layer 70. Thus, layer 26 reduces the susceptibility of circuit 10 to charge gain and loss problems.

Figure 2:
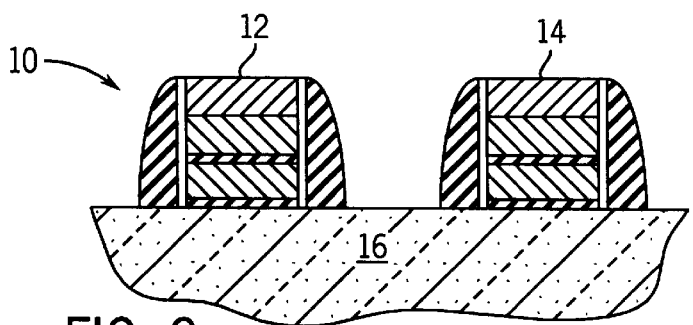
FIG. 2 is a cross sectional view of the integrated circuit illustrated in FIG. 1, showing a gate stack formation step.

With reference to FIGS. 1–5, an advantageous method for manufacturing integrated circuit 10 is described below as follows. In FIG. 2, integrated circuit 10 includes transistors 12 and 14 disposed on substrate 16.

Figure 3:
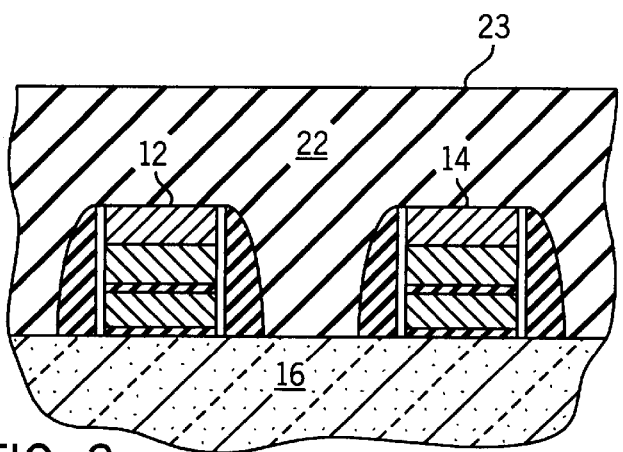
FIG. 3 is a cross sectional view of the integrated circuit illustrated in FIG. 2, showing an interlayer dielectric deposition step.

With reference to FIG. 3, transistors 12 and 14 are covered by interlevel dielectric layer 22, which is preferably a BPSG layer. Interlevel dielectric layer 22 is preferably deposited by CMP as a 15000 Å thick layer and polished back to 9000 Å. Alternatively, interlevel dielectric layer 22 can be silicon dioxide deposited in a tetraethylorthosilicate (TEOS) process or other insulative material. Interlevel dielectric layer 22 is flowed at approximately 800 to 850° C.

Figure 4:
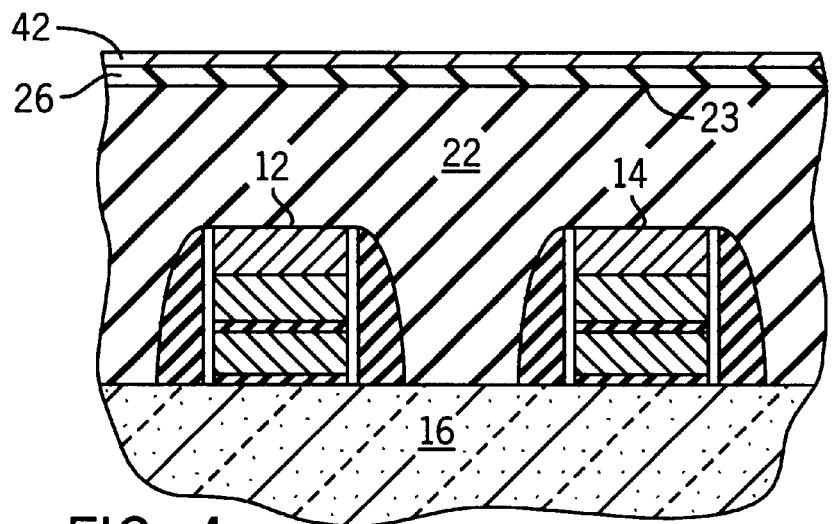
FIG. 4 is a cross sectional view of the integrated circuit illustrated in FIG. 3, showing a silicon nitride deposition step.

In FIG. 4, layer 26 is deposited on top surface 23. Layer 26 is preferably a 100 to 1000 Å thick layer of silicon nitride ($Si_3N_4$) material deposited by PECVD or LPCVD. An anti-reflective coating layer 42 is deposited on top of layer 26. Anti-reflective coating layer 42 is preferably a bottom anti-reflective coating (BARC) layer for contact etching and has a thickness from 100–1000 Å (e.g., 400 Å). Anti-reflective coating layer 42 can be silicon oxynitride (SiON) deposited by LPCVD or PE CVD, with 3–30% nitrogen (e.g., 10–20%). Anti-reflective coating layer 42 is advantageously deposited on top of interlevel dielectric layer 22. By depositing anti-reflective coating layer 42 on top of layer 26, instead of directly on top of interlevel dielectric layer 22, as in conventional processes, discolorations which disturb subsequent defect inspections are prevented, as explained below.

Figure 5:
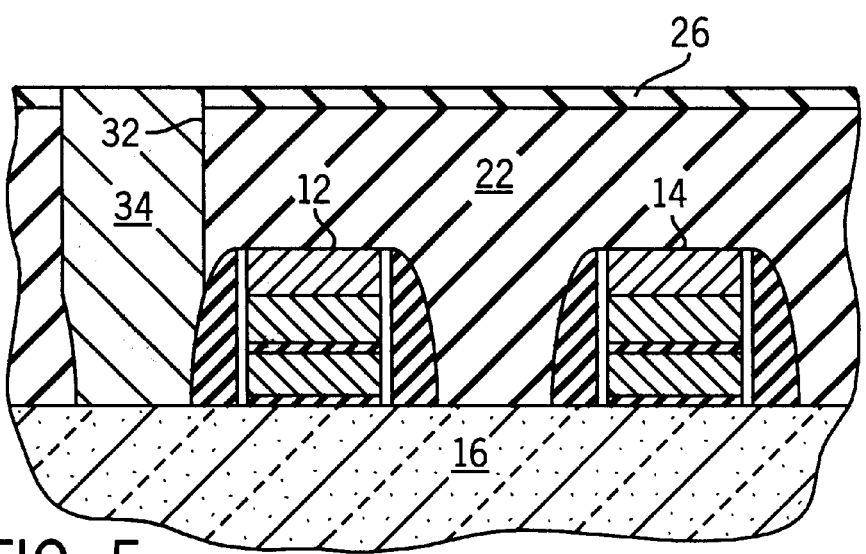
FIG. 5 is a cross sectional view of the integrated circuit illustrated in FIG. 4, showing an anti-reflective coating deposition step.

After anti-reflective layer 42 is provided, layers 42, 26, and 22 are masked and etched to form aperture 32 (FIG. 1) (Contact 1 masking and etching). After aperture 32 is formed, a conformal layer of conductive material, such as, tungsten, is deposited on top of anti-reflective coating layer 42 and within aperture 32. After deposition, the conformal layer is polished to remove it from above anti-reflective coating layer 42. In addition, the polishing removes anti-reflective coating layer 42. Silicon oxynitride is easily removed in a chemical mechanical polish process (CMP). However, layer 26 is relatively resistant to the CMP. Plug 34 remains in aperture 32 after the polish step (FIG. 5).

The method of the present invention advantageously reduces discoloration due to residual portions of the conformal conductive layer and anti-reflective coating layer 42 remaining on interlevel dielectric layer 22. Layer 26 prevents residue from anti-reflective coating layer 42 from discoloring interlevel dielectric layer 22. Furthermore, layer 26 adds the advantages of preventing hydrogen and moisture diffusion into interlevel dielectric layer 22. However, the use of layer 26 can lower the UV transparency and UV erase efficiency associated with the fabrication of integrated circuit 10.

The embodiment is described as a fabrication related to a contact formation between a substrate and a metal 1 layer.

However, principles of the embodiment can be utilized with any interlevel dielectric layer (ILD0, ILD1, ILD2, etc.) In addition, although particular materials for layers 42 and 26 are described, other suitable materials can be utilized. Further still, layers 42 and 26 can be utilized wherever anti-reflective coatings are necessary.

The foregoing description is of preferred exemplary embodiments of the present invention and has been presented for the purpose of illustration and description only. It is not intended to be exhaustive or to limit the invention to the precise form disclosed. Modifications and variations are possible in light of the above teachings or may be acquired from the practice of the invention. The embodiments where chosen and described in order to explain the principles of the invention and their practicable application to enable one skilled in the art to utilize the invention in the various embodiments and with various modifications, as are suited to the particular use contemplated. For example, although only an ILD0 layer is discussed in detail, the present invention can be applied to other layers on an integrated circuit. Further, the various specific materials and dimensions are discussed in an exemplary fashion. It is intended that the scope of the invention be defined by the claims appended hereto and their equivalent.

What is claimed is:

1. A method of fabricating an integrated circuit, the integrated circuit having a contact, the method comprising:

depositing an insulative layer over a gate stack;

depositing a barrier layer over the insulative layer;

depositing an anti-reflective coating layer over the barrier layer;

etching the insulative layer, the barrier layer, and the anti-reflective coating layer to form an aperture for the contact;

depositing a conformal conductive layer over the anti-reflective coating layer and in the aperture; and removing the conformal conductive layer above the anti-reflective coating layer and the anti-reflective coating layer by a polishing technique, thereby leaving conductive material associated with the conformal conductive layer in the aperture to form the contact.

2. The method of claim 1, wherein the anti-reflective coating layer is a bottom anti-reflective coating layer.

3. The method of claim 2, wherein the anti-reflective coating layer is silicon oxynitride.

4. The method of claim 3, wherein the barrier layer comprises silicon nitride.

5. The method of claim 4, wherein the barrier layer is between 100 and 1000 Å thick and the anti-reflective coating layer is 100 to 1000 Å thick.

6. The method of claim 1 wherein the conformal conductive layer is tungsten.

7. A method of fabricating a contact for an integrated circuit including a gate stack covered by an insulative layer, the method comprising:

depositing a silicon nitride layer over the insulative layer;

depositing a silicon oxynitride layer over the silicon nitride layer;

etching an aperture through the insulative layer, the silicon nitride layer, and the silicon oxynitride layer; and depositing a tungsten material in the aperture to form the contact;

wherein the tungsten material is deposited in the aperture and above the silicon oxynitride layer.

8. The method of claim 7, wherein the silicon oxynitride is 100 to 1000 Å thick.

9. The method of claim 8 further comprising:

removing the tungsten material above the silicon oxynitride layer with a chemical mechanical polish.

10. The method of claim 9 further comprising:

removing the silicon oxynitride layer with a chemical mechanical polish.

11. The method of claim 10, wherein the silicon nitride layer remains after the chemical mechanical polish.

12. The method of claim 7, wherein the insulative layer is an interlevel dielectric layer (ILD0) layer.

13. The method of claim 12, wherein the silicon oxynitride layer is between 100 and 1000 Å thick.

14. The method of claim 13, wherein the silicon nitride layer is 100 to 1000 Å thick.

15. A method of manufacturing an integrated circuit, the integrated circuit having a contact with reduced charge gain or charge loss, the method comprising:

depositing an insulative layer over a gate stack;

depositing a barrier layer over the insulative layer;

depositing an anti-reflective coating layer over the barrier layer;

etching the insulative layer, the barrier layer, and the anti-reflective coating layer to form an aperture;

depositing a conformal conductive layer over the anti-reflective coating layer and in the aperture; and removing the conformal conductive layer above the anti-reflective coating layer and the anti-reflective coating layer by a polishing technique, thereby leaving conductive material in the aperture to form contact.

16. The method of claim 15, wherein the anti-reflective coating layer is a bottom anti-reflective coating layer.

17. The method of claim 15, wherein the anti-reflective coating layer is silicon oxynitride.

18. The method of claim 15, wherein the barrier layer is a silicon nitride layer and is between 100 and 1000 Å thick.

19. The method of claim 17, wherein the silicon anti-reflective coating layer is 100 to 1000 Å thick.

20. The method of claim 15, wherein the conformal conductive layer is tungsten.

* * * * *

UNITED STATES PATENT AND TRADEMARK OFFICE
CERTIFICATE OF CORRECTION

PATENT NO. : 6,265,294 B1
DATED : July 24, 2001
INVENTOR(S) : Park et al.

Page 1 of 1

It is certified that error appears in the above-identified patent and that said Letters Patent is hereby corrected as shown below:

<u>Column 6, claim 15,</u>
Line 44, insert the word "the" between the words "form" and "contact".

Signed and Sealed this

Twenty-ninth Day of January, 2002

Attest:

Attesting Officer

JAMES E. ROGAN
*Director of the United States Patent and Trademark Office*